United States Patent
Yeh et al.

(10) Patent No.: US 10,703,625 B1
(45) Date of Patent: Jul. 7, 2020

(54) MICROELECTROMECHANICAL SYSTEM (MEMS) APPARATUS WITH ADJUSTABLE SPRING

(71) Applicant: INDUSTRIAL TECHNOLOGY RESEARCH INSTITUTE, Hsinchu (TW)

(72) Inventors: Chien-Nan Yeh, Tainan (TW); Yu-Wen Hsu, Tainan (TW); Chao-Ta Huang, Hsinchu (TW)

(73) Assignee: INDUSTRIAL TECHNOLOGY RESEARCH INSTITUTE, Hsinchu (TW)

( * ) Notice: Subject to any disclaimer, the term of this patent is extended or adjusted under 35 U.S.C. 154(b) by 0 days.

(21) Appl. No.: 16/369,542

(22) Filed: Mar. 29, 2019

(51) Int. Cl.
*H01L 29/84* (2006.01)
*B81B 3/00* (2006.01)

(52) U.S. Cl.
CPC .... *B81B 3/0027* (2013.01); *B81B 2201/0278* (2013.01)

(58) Field of Classification Search
CPC .......... B81B 3/0027; B81B 2201/0257; B81B 2201/0278
See application file for complete search history.

(56) References Cited

U.S. PATENT DOCUMENTS

| | | | |
|---|---|---|---|
| 6,594,059 B2 | 7/2003 | Flanders | |
| 7,767,483 B1 | 8/2010 | Waters | |
| 8,683,847 B2 | 4/2014 | Moon et al. | |
| 8,925,384 B2 | 1/2015 | McNeil et al. | |
| 9,972,763 B2 | 5/2018 | Zhan et al. | |
| 2008/0134753 A1 | 6/2008 | Jun et al. | |
| 2012/0186346 A1 | 7/2012 | McNeil et al. | |
| 2016/0318753 A1* | 11/2016 | Chou | B81B 3/001 |
| 2017/0089945 A1 | 3/2017 | Naumann | |
| 2017/0176942 A1* | 6/2017 | Kohler | G04B 17/066 |
| 2018/0052124 A1 | 2/2018 | Rogers et al. | |
| 2020/0057029 A1* | 2/2020 | Irie | G01N 29/12 |

FOREIGN PATENT DOCUMENTS

| | | |
|---|---|---|
| CN | 104246995 A | 12/2014 |
| TW | 200728605 A | 8/2007 |

(Continued)

OTHER PUBLICATIONS

Analysis and Simulation of Serpentine Suspensions for MEMS Applications, M. Bedier 1,2 and Roshdy AbdelRassoul 2, International Journal of Materials Science and Engineering, Dec. 2013 p. 82-85.

(Continued)

*Primary Examiner* — Phuc T Dang
(74) *Attorney, Agent, or Firm* — Maschoff Brennan (57) ABSTRACT

A MEMS apparatus with adjustable spring includes a central portion, a peripheral portion and at least one spring. The peripheral portion surrounds the central portion and is spaced apart from the central portion. The spring includes a peripheral section, an outward extension section and a central section. The peripheral section is connected to the outward extension section. An amount of thermal expansion per unit temperature change of the outward extension section is greater than that of the peripheral section or greater than that of the central section.

24 Claims, 7 Drawing Sheets

(56) References Cited

FOREIGN PATENT DOCUMENTS

TW          I452287 B    9/2014
TW          I600899 B    10/2017

OTHER PUBLICATIONS

A micromachined vibrating rate gyroscope with independent beams for the drive and detection modes, Yoichi Mochida, Masaya Tamura, Kuniki Ohwada, Sensors or Actuators Mar. 10, 2000, 170-178.
Effect of Axial Force on the Performance of Micromachined Vibratory Rate Gyroscopes, Zhanqiang Hou, Dingbang Xiao, Xuezhong Wu *, Peitao Dong, Zhihua Chen, Zhengyi Niu and Xu Zhang, sensors Dec. 29, 2010 p. 296-309.
TW Office Action in application No. 108111377 dated Aug. 22, 2019.

* cited by examiner

MICROELECTROMECHANICAL SYSTEM (MEMS) APPARATUS WITH ADJUSTABLE SPRING

TECHNICAL FIELD

The disclosure relates to a microelectromechanical system (MEMS) apparatus with adjustable spring, more particularly to a MEMS apparatus with adjustable spring that is capable of reducing the effect of thermal stress.

BACKGROUND

When a sensing process is performed by a microelectromechanical system (MEMS) sensor, in order to measure the characteristics of the target object accurately, such as the concentration of a specific gas, a technique that can heat the MEMS sensor up to a specific operating temperature is used.

However, when the temperature of the MEMS rises by heating, the MEMS sensor will be expanded, resulting in unwanted deformation or unwanted warpage at the sensing area of the MEMS sensor.

When the MEMS sensor is unwantedly deformed, the sensing accuracy of the MEMS sensor is reduced. If the MEMS sensor is excessively deformed, the MEMS sensor would be fractured to decrease the reliability of the MEMS sensor.

SUMMARY

Accordingly, the present disclosure provides a microelectromechanical system (MEMS) apparatus with adjustable spring which is able to prevent excessive deformation by reducing the effect of thermal stress, thereby improving the reliability and measurement accuracy of the MEMS apparatus with adjustable spring.

One embodiment of the disclosure provides a microelectromechanical system (MEMS) apparatus with adjustable spring including a central portion, a heater, a peripheral portion and a spring. The central portion includes a center of mass. The heater is disposed on the central portion. The peripheral portion surrounds the central portion and is spaced apart from the central portion. The spring includes a central section, a peripheral section, an outward extension section, and an inner connection section. The central section extends along an axis that passes through the center of mass. The central section has an inner end and an outer end, and the inner end of the central section connects to the central portion. The peripheral section extends along a direction parallel to the axis. The peripheral section has an inner end and an outer end, and the outer end of the peripheral section connects to the peripheral portion. The outward extension section has an inner end and an outer end. The inner connection section connects to the inner end of the peripheral section and the inner end of the outward extension section respectively. An amount of thermal expansion per unit temperature change of the outward extension section is greater than an amount of thermal expansion per unit temperature change of the peripheral section or greater than an amount of thermal expansion per unit temperature change of the central section.

According to the MEMS apparatus with adjustable spring of one embodiment of the disclosure, when the MEMS apparatus with adjustable spring is expanded due to temperature rise, the amount of thermal expansion of the spring to push the central portion is represented as: (the amount of thermal expansion of the peripheral section in the long axis)−(the amount of thermal expansion of the outward extension section in the long axis)+(the amount of thermal expansion of the central section in the long axis). Since the amount of thermal expansion per unit temperature change of the outward extension section is greater than the amount of thermal expansion per unit temperature change of the peripheral section or greater than the amount of thermal expansion per unit temperature change of the central section, the amount of thermal expansion of the outward extension section in the long axis is greater than the amount of thermal expansion of the peripheral section in the long axis or greater than the amount of thermal expansion of the central section in the long axis. Therefore, the amount of thermal expansion of the spring to push the central portion is decreased and thus suppressing the situation that the spring pushes the central portion, such that the central portion is prevented from being excessively deformed by the spring during the thermal expansion, and thereby improving the reliability and measurement accuracy of the MEMS apparatus with adjustable spring.

The above descriptions of the present disclosure and the following descriptions of the embodiments of the present disclosure are intended to illustrate and explain the spirit and principles of the disclosure and provide a further explanation of the scope of the claims of the disclosure.

DETAILED DESCRIPTION

In the following detailed description, for purposes of explanation, numerous specific details are set forth in order to provide a thorough understanding of the disclosed embodiments. It will be apparent, however, that one or more embodiments may be practiced without these specific details. In other instances, well-known main structures and devices are schematically shown in order to simplify the drawing.

In the drawings of the disclosure, the features may be exaggerated in dimensions, ratios, angles and the like for the purpose of illustration, but the disclosure is not limited thereto. Various changes can be made without departing from the spirit of the disclosure. The directional terms, such as front, rear, top, bottom and the like mentioned in the specification are for illustration but not intended to limit the disclosure.

Figure 1:
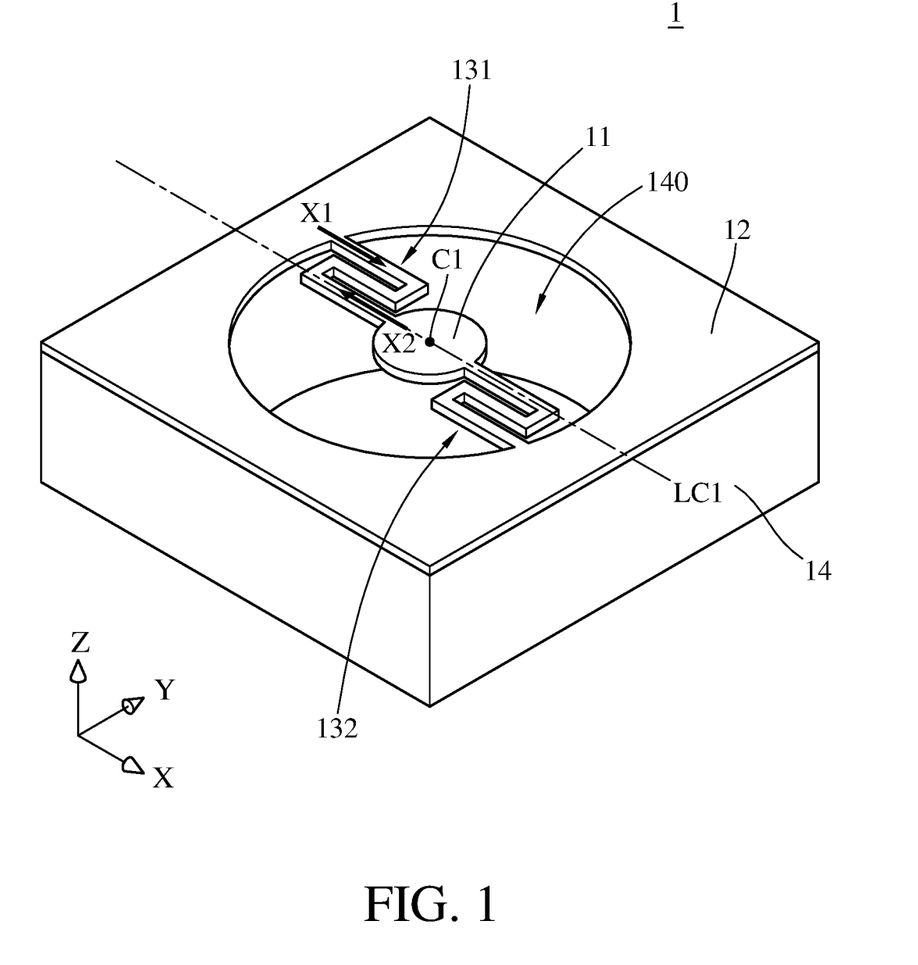
FIG. 1 is a perspective view of a MEMS apparatus with adjustable spring according to one embodiment of the disclosure.
Figure 2:
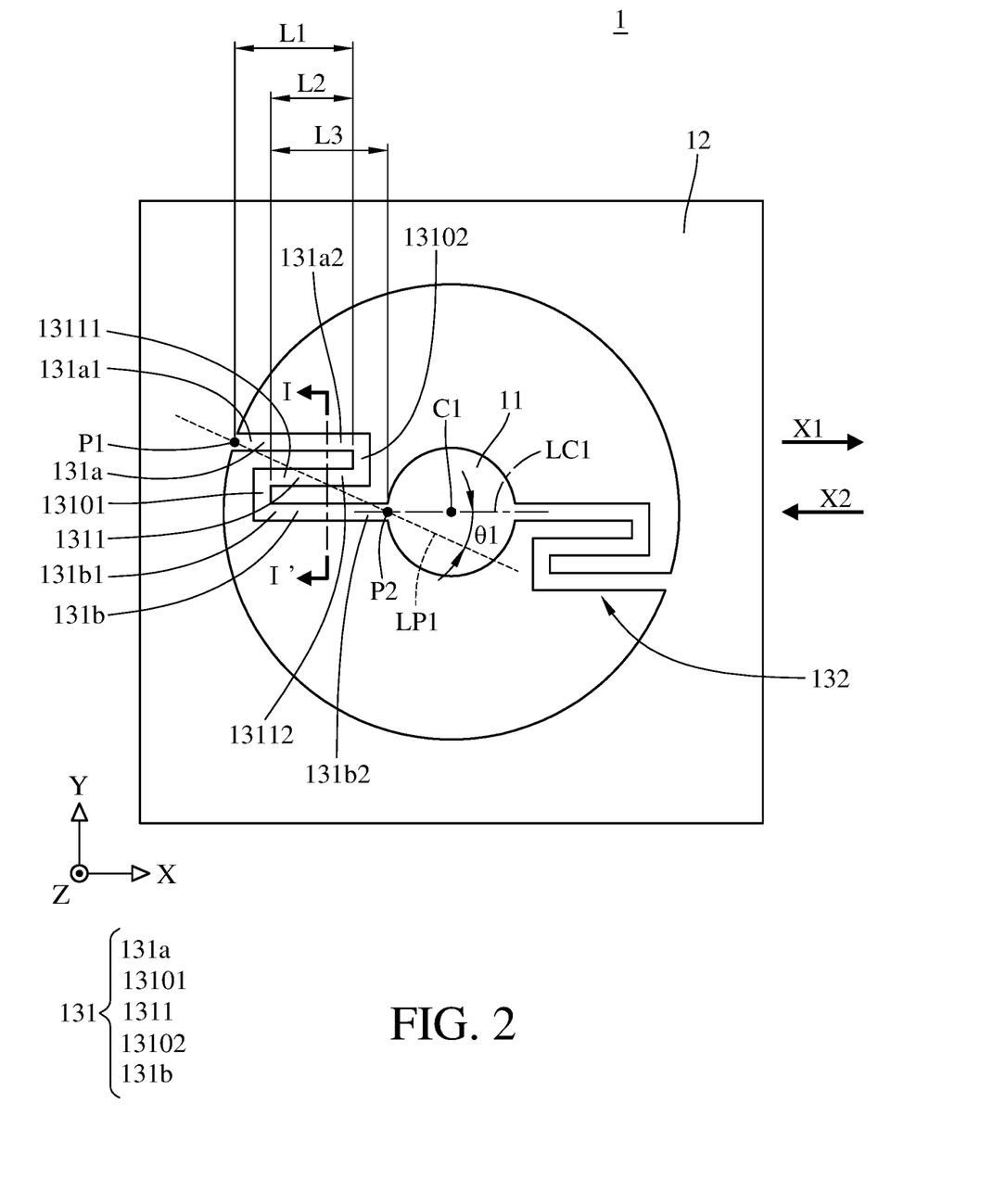
FIG. 2 is a top view of the MEMS apparatus with adjustable spring in FIG. 1.
Figure 3:
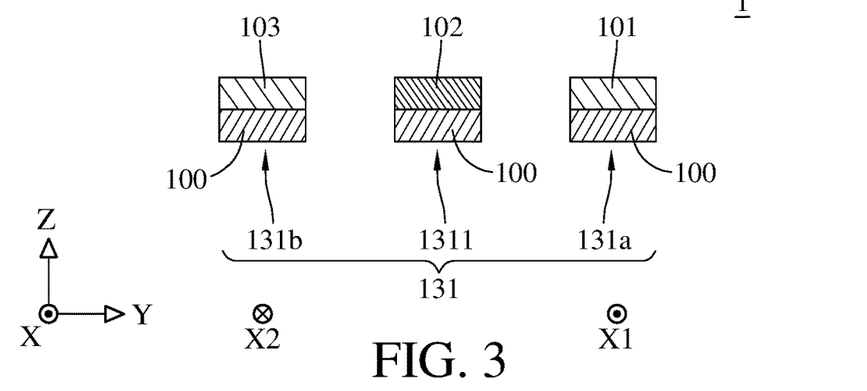
FIG. 3 is a side cross-sectional view of a spring in the MEMS apparatus with adjustable spring, taken along I-I' line in FIG. 2.

Please refer to FIG. 1, FIG. 2, and FIG. 3. FIG. 1 is a perspective view of a MEMS apparatus with adjustable spring according to one embodiment of the disclosure. FIG. 2 is a top view of the MEMS apparatus with adjustable spring in FIG. 1. FIG. 3 is a side cross-sectional view of a spring in the MEMS apparatus with adjustable spring, taken along I-I' line in FIG. 2.

As shown in FIG. 1, in this embodiment, a microelectromechanical system (MEMS) apparatus with adjustable spring 1 includes a central portion 11, a peripheral portion 12, a first spring 131, a second spring 132 and a base portion 14. The MEMS apparatus with adjustable spring 1 may be a gas sensor or other types of sensing device with heater, but the disclosure is not limited thereto. The base portion 14 of the MEMS apparatus with adjustable spring 1 may be a silicon base, silicon on insulator (SOI) base, silicon on sapphire (SOS) base, or silicon on glass (SOG) base. In one embodiment, the base portion 14 includes a silicon base.

The peripheral portion 12 surrounds the central portion 11 and is spaced apart from the central portion 11. The peripheral portion 12 may be in an annular shape. The central portion 11 may include a sensing material layer for providing sensing function. A heater (not shown) may be disposed on the central portion 11. The heater may be embedded inside the central portion 11, but the disclosure is not limited thereto. The heater may also be disposed on the surface of the central portion 11. The first spring 131 connects to the central portion 11 and the peripheral portion 12, and the second spring 132 also connects to the central portion 11 and the peripheral portion 12. The first spring 131 and the second spring 132 are symmetric with respect to a center of mass C1 of the central portion 11 and are point-symmetrically connected to the central portion 11 and the peripheral portion 12. The peripheral portion 12 is fixed on the base portion 14. The base portion 14 has a chamber 140. The central portion 11 is suspended above the chamber 140 by being connected to the first spring 131 and the second spring 132.

As shown in FIG. 2, the central portion 11 may be in circle shape, but the disclosure is not limited thereto. In some other embodiments, the central portion 11 may be in rectangle shape or other shapes.

In addition, as shown in FIG. 1 and FIG. 2, in this embodiment, the first spring 131 includes a peripheral section 131a, an outward extension section 1311, a central section 131b, an outer connection section 13101 and an inner connection section 13102. The second spring 132 is similar to the first spring 131. The followings are mainly to describe the detail of the first spring 131, the second spring 132 has similar configuration and characteristic to that of the first spring 131, so the detail of the second spring 132 will not be repeated hereinafter.

The peripheral section 131a has an outer end 131a1 and an inner end 131a2. The peripheral section 131a extends along a first axial direction X1 (parallel to a direction from a point P2 to the center of mass C1) from the peripheral portion 12. The outer end 131a1 of the peripheral section 131a connects to the peripheral portion 12 at the point P1. The outward extension section 1311 has an outer end 13111 and an inner end 13112. The inner connection section 13102 connects to the inner end 131a2 of the peripheral section 131a and the inner end 13112 of the outward extension section 1311. The central section 131b has an outer end 131b1 and an inner end 131b2. The central section 131b extends along a second axial direction X2 (a direction from the center of mass C1 to a point P2) from the central portion 11. The inner end 131b2 of the central section 131b connects to the central portion 11 at the point P2. The outer connection section 13101 connects to the outer end 131b1 of the central section 131b and the outer end 13111 of the outward extension section 1311. An axis LC1 that passes through the point P2 and the center of mass C1 of the central portion 11 is substantially parallel to the first axial direction X1 and the second axial direction X2. The first axial direction X1 is parallel to but opposite to the second axial direction X2. A straight line LP1 that passes through the point P1 and the point P2, is at an acute angle of θ1 with respect to the axis LC1.

An amount of thermal expansion per unit temperature change of the outward extension section 1311 is greater than an amount of thermal expansion per unit temperature change of the peripheral section 131a or greater than an amount of thermal expansion per unit temperature change of the central section 131b. In some other embodiments, to further decrease the thermal stress applied on the central portion 11, the amount of thermal expansion per unit temperature change of the outward extension section 1311 can be greater than the amount of thermal expansion per unit temperature change of the peripheral section 131a and greater than the amount of thermal expansion per unit temperature change of the central section 131b.

In the disclosure, the amount of thermal expansion in long side direction can be defined as: the amount of extension of an object in the long side direction caused by the increment of temperature, and which is in direct proportion to the temperature difference caused by the increment of temperature. The amount of thermal expansion per unit temperature change can be defined as: the amount of extension of an object in the long side direction caused by a unit temperature increment, which is in direct proportion to the length of the object in the long side direction and is in direct proportion to an effective coefficient of thermal expansion of the object in the long side direction.

In the disclosure, the effective coefficient of thermal expansion can be defined as: a ratio of the deformation of an object in an axial direction to the length of an object in the axial direction when a unit temperature is increased. In the case of the object made of multiple materials, the effective coefficient of thermal expansion can be obtained by giving each coefficient of thermal expansion of multiple materials proper weighting. In the case of the object made of a single material, the effective coefficient of thermal expansion is the coefficient of thermal expansion of the single material.

In this embodiment, an effective coefficient of thermal expansion α2 of the outward extension section 1311 is greater than an effective coefficient of thermal expansion α1 of the peripheral section 131a or greater than an effective coefficient of thermal expansion α3 of the central section 131b. In some other embodiments, to further decrease the thermal stress applied on the central portion 11, the effective coefficient of thermal expansion α2 of the outward extension section 1311 can be greater than the effective coefficient of thermal expansion α1 of the peripheral section 131*a* and greater than the effective coefficient of thermal expansion α3 of the central section 131*b*.

When the MEMS apparatus with adjustable spring 1 is heated by the heater and expanded, an amount of thermal expansion (ΔL) of the first spring 131 to push the central portion 11 along the first axial direction X1 can be expressed as: "an amount of thermal expansion of the peripheral section 131*a* along the first axial direction X1" minus "an amount of thermal expansion of the outward extension section 1311 along the first axial direction X1" plus "an amount of thermal expansion of the central section 131*b* along the first axial direction X1". That is, ΔL=(L1×α1×ΔT)−(L2×α2×ΔT)+(L3×α3×ΔT), wherein L1 represents a length of the peripheral section 131*a* in the first axial direction X1, L2 represents a length of the outward extension section 1311 in the first axial direction X1, L3 represents a length of the central section 131*b* in the first axial direction X1, and ΔT represents the temperature increment caused by the heater.

The amount of thermal expansion per unit temperature change of the peripheral section 131*a* is (L1×α1). The amount of thermal expansion per unit temperature change of the outward extension section 1311 is (L2×α2). The amount of thermal expansion per unit temperature change of the central section 131*b* is (L3×α3).

The amount of thermal expansion per unit temperature change of the outward extension section 1311 is greater than the amount of thermal expansion per unit temperature change of the peripheral section 131*a* or the amount of thermal expansion per unit temperature change of the central section 131*b*. It means that (L2×α2×ΔT)>(L1×α1×ΔT), or (L2×α2×ΔT)>(L3×α3×ΔT). The outward extension section 1311 has a thermal expansion in the second axial direction X2 after it is heated, such that the amount of thermal expansion (ΔL) of the first spring 131 which pushes the central portion 11 along the first axial direction X1 is decreased. Similarly, the second spring 132 is also able to decrease the amount of thermal expansion (ΔL) which pushes the central portion 11. The total amount of thermal expansion (ΔL) which pushes the central portion 11 is decreased to prevent excessive deformation of the central portion 11 or excessive warpage of the central portion 11. It thus improves the reliability and measurement accuracy of the MEMS apparatus with adjustable spring 1.

As shown in FIG. 3, the first spring 131 includes a base layer 100 and adjustment layers 101, 102 and 103. The base layer 100 may be made of semiconductor material such as silicon. The adjustment layers are disposed on the base layer. In some other embodiments, the adjustment layers may include silicon dioxide, silicon nitride, nitrogen oxide, silicon carbide, hafnium nitride, zirconium oxide. The central section 131*b* of the first spring 131 includes a base layer 100 and an adjustment layer 103. The outward extension section 1311 of the first spring 131 includes a base layer 100 and an adjustment layer 102. The peripheral section 131*a* of the first spring 131 includes a base layer 100 and an adjustment layer 101. In this embodiment, a coefficient of thermal expansion of the adjustment layer 102 is greater than a coefficient of thermal expansion of the adjustment layer 101 or greater than a coefficient of thermal expansion of the adjustment layer 103. In some other embodiments, to further decrease the thermal stress applied on the central portion 11, the coefficient of thermal expansion of the adjustment layer 102 can be greater than the coefficient of thermal expansion of the adjustment layer 101 and greater than the coefficient of thermal expansion of the adjustment layer 103.

A volume ratio of the adjustment layer 101 of the peripheral section 131*a* to the base layer 100 of the peripheral section 131*a* is expressed as a first volume ratio (V1). A volume ratio of the adjustment layer 102 of the outward extension section 1311 to the base layer 100 of the outward extension section 1311 is expressed as a second volume ratio (V2). A volume ratio of the adjustment layer 103 of the central section 131*b* to the base layer 100 of the central section 131*b* is expressed as a third volume ratio (V3).

In this embodiment, the second volume ratio (V2) is equal to the first volume ratio (V1), and is equal to the third volume ratio (V3). Therefore, the effective coefficient of thermal expansion of the outward extension section 1311 is greater than that of the peripheral section 131*a*, or the effective coefficient of thermal expansion of the outward extension section 1311 is greater than that of the central section 131*b*. When the first spring 131 is heated and expanded, the amount of thermal expansion of the outward extension section 1311 in the second axial direction X2 is greater than that of the peripheral section 131*a* in the first axial direction X1, or the amount of thermal expansion of the outward extension section 1311 in the second axial direction X2 is greater than that of the central section 131*b* in the first axial direction X1. Therefore, the amount of thermal expansion (ΔL) of the first spring 131 in the first axial direction X1 is decreased to reduce amount of the deformation and amount of the warpage of the central portion 11.

In some embodiments, the coefficient of thermal expansion of the adjustment layer 102 is equal to that of the adjustment layer 101 and equal to that of the adjustment layer 103. In the embodiment that the adjustment layer 101, the adjustment layer 102 and the adjustment layer 103 are made of the same material. The second volume ratio (V2) is not equal to the first volume ratio (V1), and is not equal to the third volume ratio (V3). As a result, it can adjust the effective coefficient of thermal expansion of the outward extension section 1311 to be greater than that of the peripheral section 131*a* or to be greater than that of the central section 131*b*.

Figure 4:
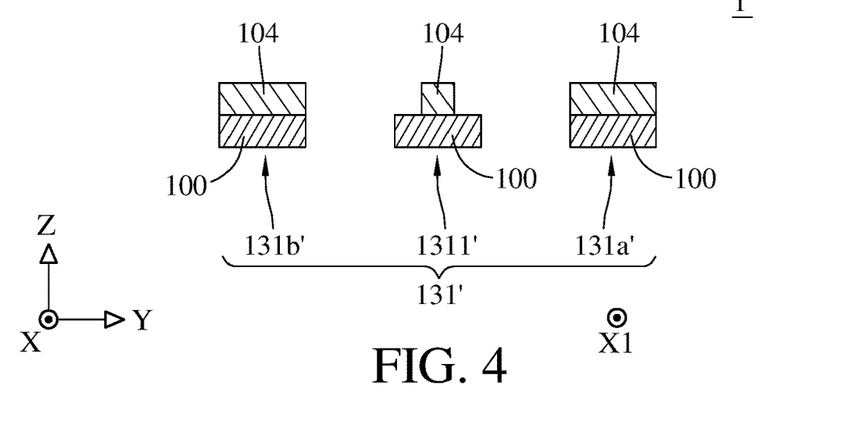
FIG. 4 is a side cross-sectional view of a spring in a MEMS apparatus with adjustable spring according to another embodiment of the disclosure.

Please refer to FIG. 4. It is a cross-sectional view of a spring of a MEMS apparatus with adjustable spring according to another embodiment of the disclosure. In a MEMS apparatus with adjustable spring 1' of this embodiment, a first spring 131' includes a peripheral section 131*a*', an outward extension section 1311' and a central section 131*b*'. The central section 131*b*' includes a base layer 100 and an adjustment layer 104. The outward extension section 1311' includes a base layer 100 and an adjustment layer 104. The peripheral section 131*a*' includes a base layer 100 and an adjustment layer 104. In this embodiment, the coefficient of thermal expansion of the adjustment layer 104 is less than that of the base layer 100.

In this embodiment, a volume ratio of the adjustment layer 104 of the peripheral section 131*a*' to the base layer 100 of the peripheral section 131*a*' is expressed as a first volume ratio (V1'). A volume ratio of the adjustment layer 104 of the outward extension section 1311' to the base layer 100 of the outward extension section 1311' is expressed as a second volume ratio (V2'). A volume ratio of the adjustment layer 104 of the central section 131*b*' to the base layer 100 of the central section 131*b*' is expressed as a third volume ratio (V3'). As shown in FIG. 4, the second volume ratio (V2') is less than the first volume ratio (V1') or less than the third volume ratio (V3'). Hence, the effective coefficient of thermal expansion of the outward extension section 1311' is greater than that of the peripheral section 131*a*' or greater than that of the central section 131b'. Therefore, the amount of thermal expansion (ΔL) of the first spring 131' along the first axial direction X1 is decreased to reduce the amount of deformation and the amount of warpage of the central portion.

In some other embodiments, in order to further decrease the thermal stress on the central portion, the second volume ratio (V2') can be less than the first volume ratio (V1') and less than the third volume ratio (V3'). This makes the effective coefficient of thermal expansion of the outward extension section 1311' be greater than that of the peripheral section 131a' and greater than that of the central section 131b'.

Figure 5:
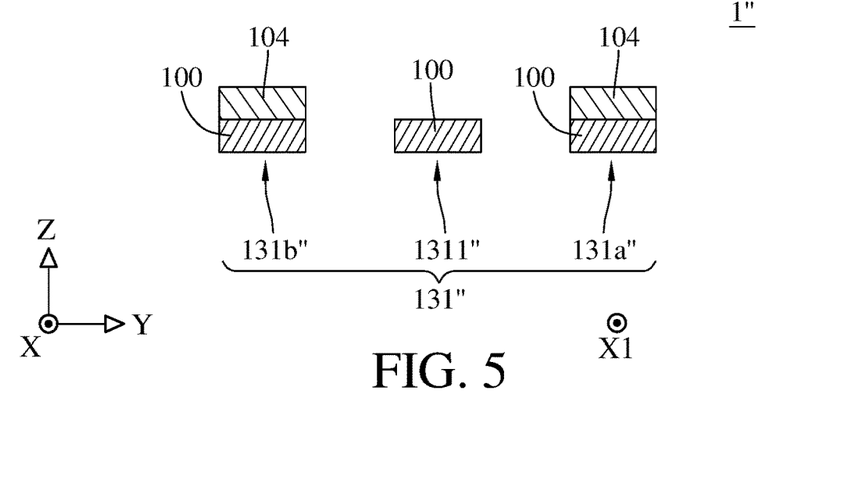
FIG. 5 is a side cross-sectional view of a spring in a MEMS apparatus with adjustable spring according to another embodiment of the disclosure.

Please refer to FIG. 5, which is a cross-sectional view of a spring of a MEMS apparatus with adjustable spring according to another embodiment of the disclosure. In a MEMS apparatus with adjustable spring 1" of this embodiment, the coefficient of thermal expansion of the adjustment layer 104 is less than that of the base layer 100. An outward extension section 1311" of a first spring 131" includes a base layer 100 but does not include an adjustment layer 104. Therefore, in this embodiment, a second volume ratio (V2") of the adjustment layer 104 of the outward extension section 1311" to the base layer 100 of the outward extension section 1311" is zero. Accordingly, in this embodiment, the second volume ratio (V2") is less than the first volume ratio (V1") and less than the third volume ratio (V3"). As such, the amount of thermal expansion (ΔL) of the first spring 131" along the first axial direction X1 is decreased to reduce the amount of deformation and the amount of warpage of the central portion.

In some other embodiments, the first spring includes the base layer and the adjustment layer, and the coefficient of thermal expansion of the adjustment layer is greater than that of the base layer. In addition, in these embodiments, the second volume ratio is greater than the first volume ratio or greater than the third volume ratio. In some other embodiments, to further decrease the thermal stress on the central portion, the second volume ratio can be greater than the first volume ratio and can be greater than the third volume ratio.

Figure 6:
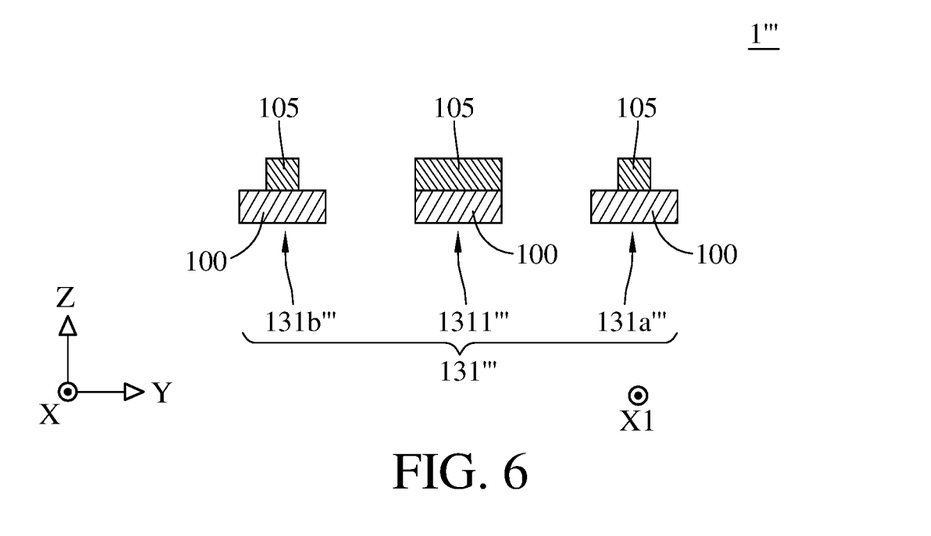
FIG. 6 is a side cross-sectional view of a spring in a MEMS apparatus with adjustable spring according to another embodiment of the disclosure.

Please refer to FIG. 6 which is a cross-sectional view of a spring of a MEMS apparatus with adjustable spring according to another embodiment of the disclosure. In a MEMS apparatus with adjustable spring 1''' of this embodiment, a first spring 131''' includes a peripheral section 131a''', an outward extension section 1311''' and a central section 131b'''. The central section 131b''' includes a base layer 100 and an adjustment layer 105. The outward extension section 1311''' includes a base layer 100 and an adjustment layer 105. The peripheral section 131a''' includes a base layer 100 and an adjustment layer 105. In this embodiment, a coefficient of thermal expansion of the adjustment layer 105 is greater than that of the base layer 100.

In this embodiment, a volume ratio of the adjustment layer 105 of the peripheral section 131a''' to the base layer 100 of the peripheral section 131a''' is a first volume ratio (V1'''). A volume ratio of the adjustment layer 105 of the outward extension section 1311''' to the base layer 100 of the outward extension section 1311''' is a second volume ratio (V2'''). A volume ratio of the adjustment layer 105 of the central section 131b''' to the base layer 100 of the central section 131b''' is a third volume ratio (V3'''). As shown in FIG. 6, the second volume ratio (V2''') is greater than the first volume ratio (V1''') or greater than the third volume ratio (V3'''). It makes an effective coefficient of thermal expansion of the outward extension section 1311''' greater than that of the peripheral section 131a''' or greater than that of the central section 131b'''. Therefore, an amount of thermal expansion (ΔL) of the first spring 131''' along the first axial direction X1 is decreased to reduce the amount of deformation and the amount of warpage of the central portion.

In some other embodiments, to further decrease the thermal stress on the central portion, the second volume ratio (V2''') can be greater than the first volume ratio (V1''') and greater than the third volume ratio (V3'''). It makes the effective coefficient of thermal expansion of the outward extension section 1311''' greater than that of the peripheral section 131a''' and greater than that of the central section 131b'''.

Figure 7:
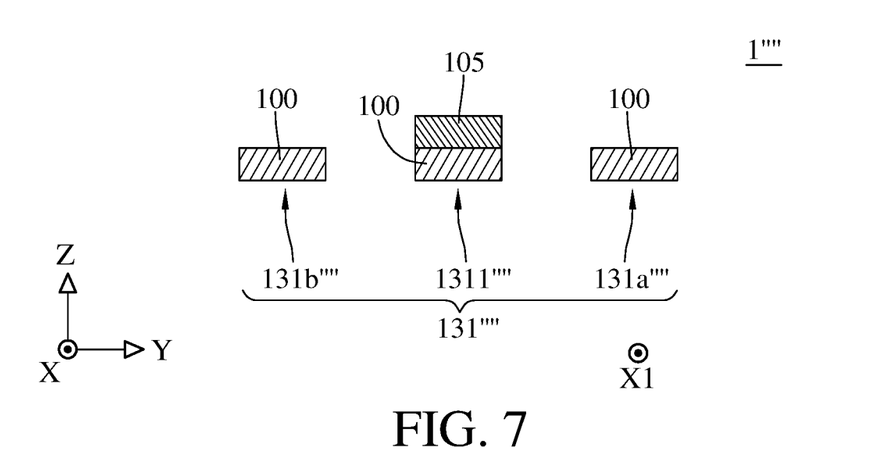
FIG. 7 is a side cross-sectional view of a spring in a MEMS apparatus with adjustable spring according to another embodiment of the disclosure.

Please refer to FIG. 7, which is a side cross-sectional view of a spring of a MEMS apparatus with adjustable spring according to another embodiment of the disclosure. In a MEMS apparatus with adjustable spring 1'''' of this embodiment, in order to make an effective coefficient of thermal expansion of the outward extension section 1311'''' further greater than that of the peripheral section 131a'''', the peripheral section 131a'''' may include the base layer 100, but does not include the adjustment layer 105 disposed on the base layer 100. Similarly, in order to make the effective coefficient of thermal expansion of the outward extension section 1311'''' further greater than that of a central section 131b'''', the central section 131b'''' may include the base layer 100, but does not include the adjustment layer 105 disposed on the base layer 100 of the central section 131b''''. In other words, a first volume ratio (V1'''') of the adjustment layer 105 of the peripheral section 131a'''' to the base layer 100 of the peripheral section 131a'''' is zero. A third volume ratio (V3'''') of the adjustment layer 105 of the central section 131b'''' to the base layer 100 of the central section 131b'''' is zero. Therefore, in this embodiment, the second volume ratio (V2'''') is greater than the first volume ratio (V1'''') and greater than the third volume ratio (V3''''). As a result, an amount of thermal expansion (ΔL) of the first spring 131'''' along the first axial direction X1 is decreased to reduce the amount of deformation and the amount of warpage of the central portion.

Figure 8A:
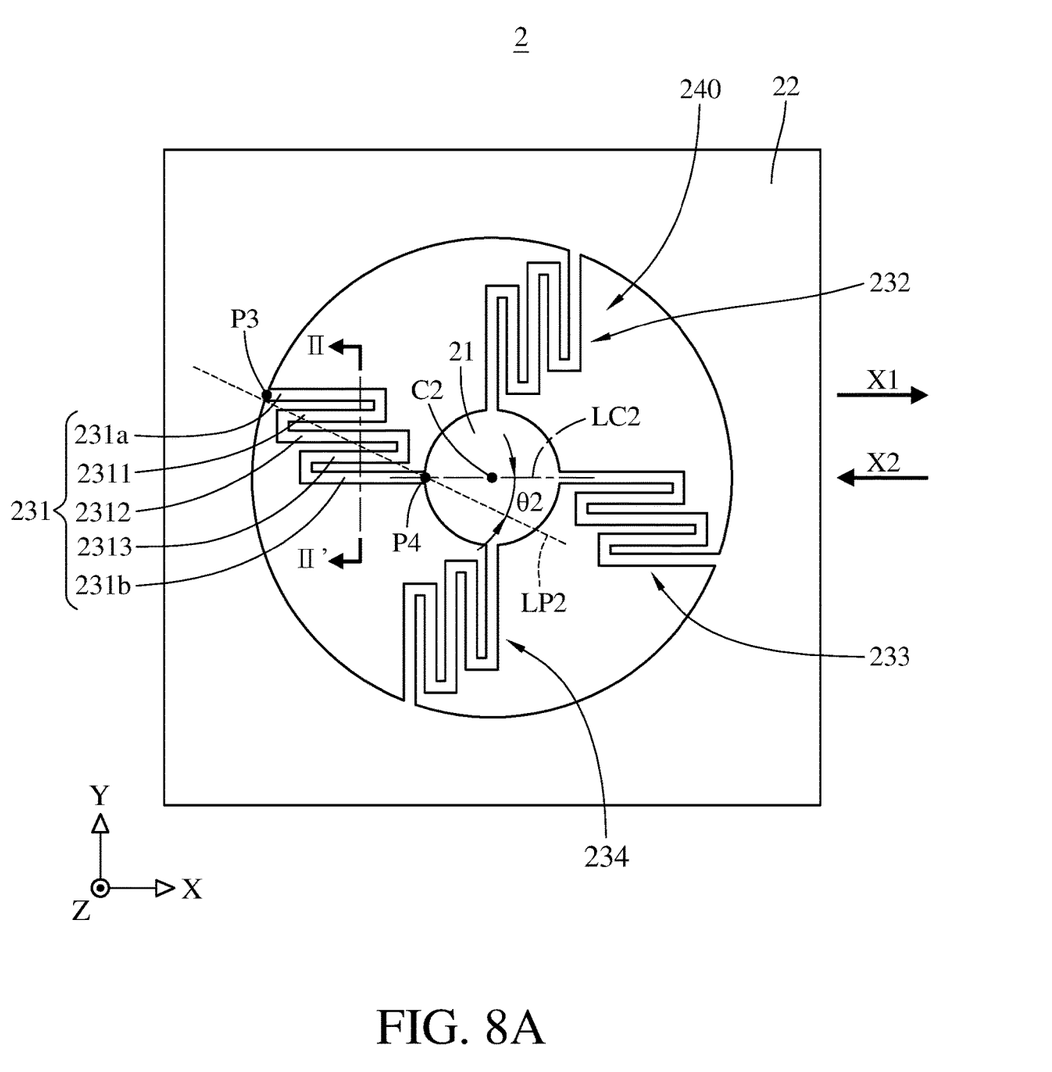
FIG. 8A is a top view of a MEMS apparatus with adjustable spring according to another embodiment of the disclosure.
Figure 8B:
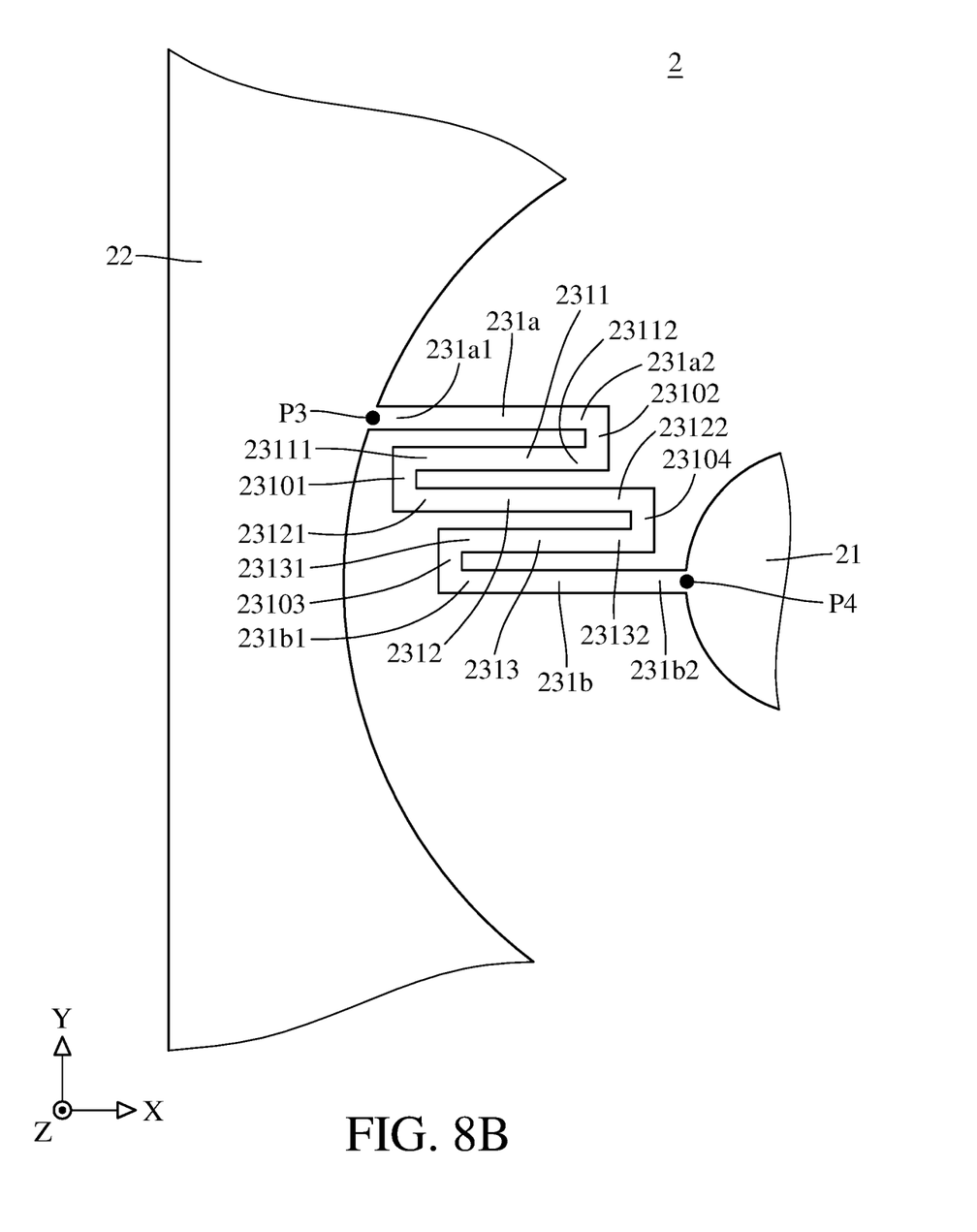
FIG. 8B is an enlarged top view of the MEMS apparatus with adjustable spring in FIG. 8A.
Figure 9:
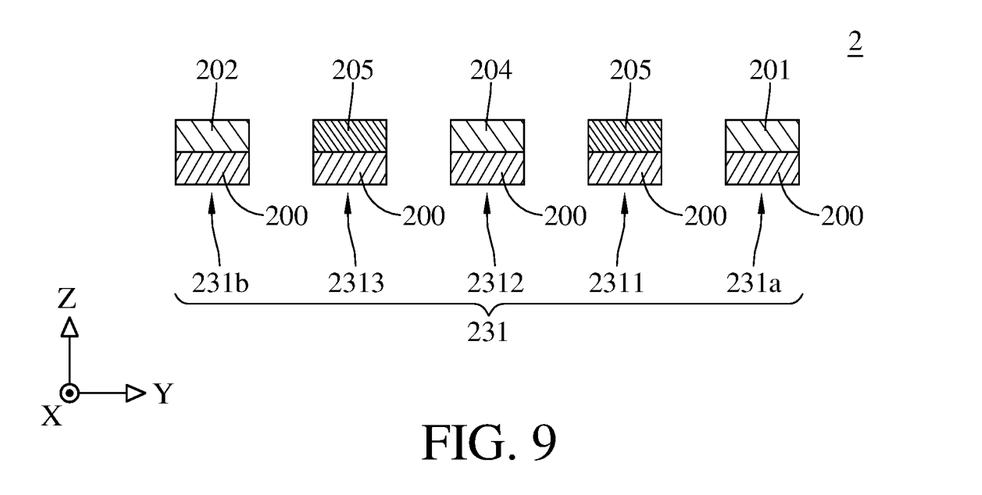
FIG. 9 is a side cross-sectional view of a spring in the MEMS apparatus with adjustable spring, taken along II-II' line in FIG. 8A.

Please refer to FIG. 8A, FIG. 8B and FIG. 9. FIG. 8A is a top view of a MEMS apparatus with adjustable spring according to another embodiment of the disclosure. FIG. 8B is an enlarged top view of the MEMS apparatus with adjustable spring in FIG. 8A. FIG. 9 is a cross-sectional view of the MEMS apparatus with adjustable spring, taken along II-II' line in FIG. 8A. As shown in FIG. 8A and FIG. 8B, in this embodiment, a MEMS apparatus with adjustable spring 2 includes a central portion 21, a peripheral portion 22, a first spring 231, a second spring 232, a third spring 233 and a fourth spring 234.

The first spring 231, the second spring 232, the third spring 233 and the fourth spring 234 are arranged clockwise and spaced apart by the same interval. These springs connect to the central portion 21 and the peripheral portion 22 respectively. The peripheral portion 22 is disposed on a base potion that has a chamber 240. The central portion 21 is connected to the first spring 231, the second spring 232, the third spring 233 and the fourth spring 234 and is suspended above the chamber 240. The central portion 21 may be in circle shape, but the disclosure is not limited thereto. In some other embodiments, the central portion 11 may be in rectangle shape or other shapes.

In this embodiment, the first spring 231, the second spring 232, the third spring 233 and the fourth spring 234 are point-symmetrically connected to the central portion 21 with respect to a center of mass C2 of the central portion 21. The second spring 232, the third spring 233 and the fourth spring 234 have similar configuration and characteristic to that of the first spring 231, so only the detail of the first spring 231 will be described hereinafter, and the details of the second spring 232, the third spring 233 and the fourth spring 234 will not be repeated.

In this embodiment, the first spring 231 includes a peripheral section 231a, an outward extension section 2311, an inward extension section 2312, another outward extension section 2313, a central section 231b, outer connection sections 23101, 23103 and inner connection sections 23102, 23104.

The peripheral section 231a has an outer end 231a1 and an inner end 231a2. The peripheral section 231a extends along a first axial direction X1 (parallel to a direction from a point P4 to the center of mass C2) from the peripheral portion 22. The outer end 231a1 of the peripheral section 231a connects to the peripheral portion 22 at the point P3. The outward extension section 2311 has an outer end 23111 and an inner end 23112. The inner connection section 23102 connects to the inner end 231a2 of the peripheral section 231a and the inner end 23112 of the outward extension section 2311.

The inward extension section 2312 has an outer end 23121 and an inner end 23122. The outer connection section 23101 connects to the outer end 23111 of the outward extension section 2311 and the outer end 23121 of the inward extension section 2312.

The another outward extension section 2313 has an outer end 23131 and an inner end 23132. The inner connection section 23104 connects to the inner end 23122 of the inward extension section 2312 and the inner end 23132 of the outward extension section 2313.

The central section 231b has an outer end 231b1 and an inner end 231b2. The central section 231b extends along the second axial direction X2 (a direction from the center of mass C2 to a point P4) from the central portion 21. The inner end 231b2 of the central section 231b connects to the central portion 21 at the point P4. The outer connection section 23103 connects to the outer end 23131 of the outward extension section 2313 and the outer end 231b1 of the central section 231b. An axis LC2 that passes through the point P4 and the center of mass C2 of the central portion 21 is substantially parallel to the first axial direction X1 and the second axial direction X2. The first axial direction X1 is parallel to but opposite to the second axial direction X2. A straight line LP2 that passes through the point P3 and the point P4 is at an acute angle of θ2 with respect to the axis LC2.

In order to decrease an amount of thermal expansion (ΔL) of the first spring 231 along the first axial direction X1, the amounts of the thermal expansion per unit temperature change of the outward extension sections 2311, 2313 are greater than that of the peripheral section 231a, and are greater than that of the central section 231b. In addition, in order to further decrease the deformation and warpage of the central portion 21, the amounts of the thermal expansion per unit temperature change of the outward extension sections 2311, 2313 are greater than that of the inward extension section 2312.

In one embodiment, the first spring 231 is made of a single material such as silicon. To make the amounts of the thermal expansion per unit temperature change of the outward extension sections 2311, 2313 greater than that of the peripheral section 231a, the lengths of the outward extension sections 2311, 2313 along the second axial direction X2 are greater than the length of the peripheral section 231a along the second axial direction X2. Similarly, when the lengths of the outward extension sections 2311, 2313 along the second axial direction X2 are greater than the length of the central section 231b along the second axial direction X2, the amounts of the thermal expansion per unit temperature change of the outward extension sections 2311, 2313 can be greater than that of the central section 231b. In addition, in order to further decrease the amount of deformation and the amount of warpage of the central portion 21, the lengths of the outward extension sections 2311, 2313 along the second axial direction X2 are greater than the length of the inward extension section 2312 along the second axial direction X2.

In another embodiment, the first spring 231 includes a base layer and an adjustment layer. The coefficient of thermal expansion of the base layer and the coefficient of thermal expansion of the adjustment layer are different from each other. To decrease the deformation and warpage of the central portion 21, effective coefficient of thermal expansions of the outward extension sections 2311, 2313 are greater than that of the peripheral section 231a and is greater than that of the central section 231b. In addition, to further decrease the deformation and warpage of the central portion 21, the effective coefficient of thermal expansions of the outward extension sections 2311, 2313 are greater than that of the inward extension section 2312. The outward extension sections 2311, 2313 with greater effective coefficient of thermal expansion will be described hereinafter.

As shown in FIG. 9, the first spring 231 includes a base layer 200 and adjustment layers 201, 202, 204 and 205. The base layer 200 may be made of semiconductor material such as silicon. In some other embodiments, the adjustment layers can be disposed on the base layer, and the adjustment layers may include silicon dioxide, silicon nitride, nitrogen oxide, silicon carbide, hafnium nitride, zirconium oxide. The central section 231b of the first spring 231 includes a base layer 200 and an adjustment layer 202. The outward extension sections 2311, 2313 of the first spring 231 includes a base layer 200 and an adjustment layer 205. The inward extension section 2312 of the first spring 231 includes a base layer 200 and an adjustment layer 201. The peripheral section 231a of the first spring 231 includes a base layer 200 and an adjustment layer 201. In this embodiment, the coefficient of thermal expansion of the adjustment layer 205 is greater than that of the adjustment layer 201 and greater than that of the adjustment layer 202. In addition, the coefficient of thermal expansion of the adjustment layer 205 is also greater than that of the adjustment layer 204. In FIG. 9, the volume ratios of the adjustment layers 201, 202, 204 and 205 to the base layer 200 are the same, so the effective coefficient of thermal expansions of the outward extension sections 2311 and 2313 are greater than that of the peripheral section 231a and greater than that of the central section 231b. In addition, the effective coefficient of thermal expansions of the outward extension sections 2311, 2313 are also greater than that of the inward extension section 2312.

Figure 10:
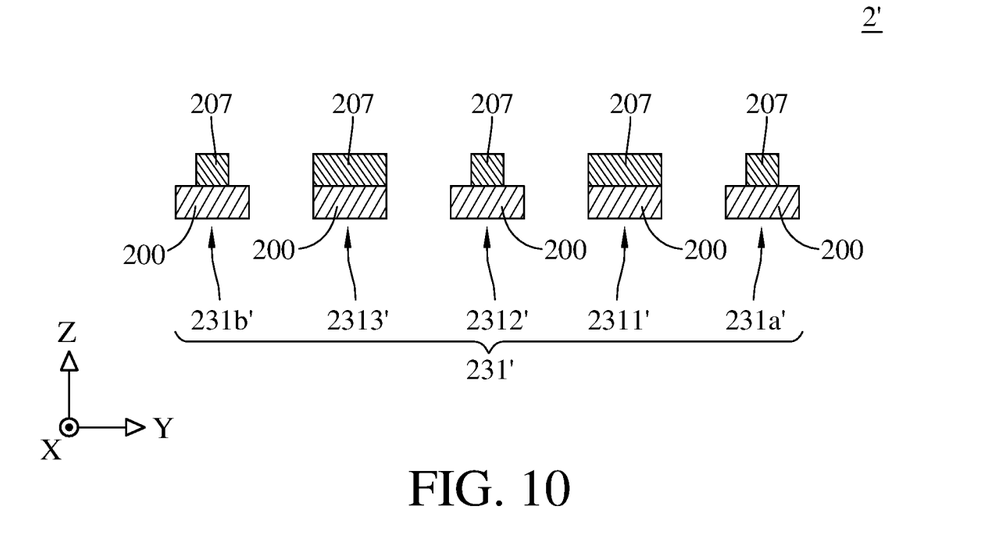
FIG. 10 is a side cross-sectional view of a spring in a MEMS apparatus with adjustable spring according to another embodiment of the disclosure.

Please refer to FIG. 10, which is a cross-sectional view of a spring in a MEMS apparatus with adjustable spring according to another embodiment of the disclosure. In a MEMS apparatus with adjustable spring 2' of this embodiment, a first spring 231' includes a base layer 200 and an adjustment layer 207. The coefficient of thermal expansion of the base layer 200 and the coefficient of thermal expansion of the adjustment layer 207 are different from each other. In this embodiment, the coefficient of thermal expansion of the adjustment layer 207 is greater than that of the base layer 200. A central section 231b' of the first spring 231' includes a base layer 200 and an adjustment layer 207.

Outward extension sections 2311', 2313' of the first spring 231' include a base layer 200 and an adjustment layer 207. An inward extension section 2312' of the first spring 231' includes a base layer 200 and an adjustment layer 207. A peripheral section 231a' of the first spring 231' includes a base layer 200 and an adjustment layer 207. In other words, the central section 231b', the outward extension sections 2311', 2313', the inward extension section 2312', the peripheral section 231a' of the first spring 231' have the same coefficient of thermal expansion of adjustment layer.

In order to make the effective coefficient of thermal expansions of the outward extension sections 2311', 2313' greater than that of the peripheral section 231a' and greater than that of the central section 231b', a volume ratio of the adjustment layer 207 to the base layer 200 is changed. For example, please refer to FIG. 10, in the peripheral section 231a', a volume ratio of the adjustment layer 207 to the base layer 200 is defined as a first volume ratio (V1). In the outward extension sections 2311', 2313', a volume ratio of the adjustment layer 207 to the base layer 200 is defined as a second volume ratio (V2). In the central section 231b', a volume ratio of the adjustment layer 207 to the base layer 200 is defined as a third volume ratio (V3). In the inward extension section 2312', a volume ratio of the adjustment layer 207 to the base layer 200 is defined as a fourth volume ratio (V4). As shown in FIG. 10, the second volume ratio (V2) is greater than the first volume ratio (V1) and greater than the third volume ratio (V3), so the effective coefficient of thermal expansions of the outward extension sections 2311', 2313' are greater than that of the peripheral section 231a' and greater than that of the central section 231b'. In addition, the second volume ratio (V2) is greater than the fourth volume ratio (V4), so the effective coefficient of thermal expansions of the outward extension sections 2311', 2313' are greater than that of the inward extension section 2312'. Accordingly, it is more efficiently to decrease the deformation and warpage of the central portion.

As discussed above, for the MEMS apparatus with adjustable spring of one embodiment of the disclosure, the amounts of thermal expansion per unit temperature change of different sections of the spring are adjustable, such that the amount of thermal expansion of the spring which pushes the central portion caused by the temperature increment can be reduced. Therefore, the excessive deformation or excessive warpage of the central portion is prevented. It improves the reliability and measurement accuracy of the MEMS apparatus with adjustable spring.

It will be apparent to those skilled in the art that various modifications and variations can be made to the present disclosure. It is intended that the specification and examples be considered as exemplary embodiments only, with a scope of the disclosure being indicated by the following claims and their equivalents.

SYMBOL DESCRIPTION 1, 1', 1", 1''', 1'''', 2, 2' MEMS apparatus with adjustable spring
100, 200 base layer
101, 102, 103, 104, 105, 201, 202, 204, 205, 207 adjustment layer
11, 21 central portion
12, 22 peripheral portion
131, 131', 131", 131''', 131'''', 132, 231, 231', 232, 233, 234 spring
13101, 23101, 23103 outer connection section
13102, 23102, 23104 inner connection section
1311, 1311', 1311", 1311''', 1311'''', 2311, 2311', 2313, 2313' outward extension section
13111, 131a1, 131b1, 23111, 23121, 23131, 231a1, 231b1 outer end
13112, 131a2, 131b2, 23112, 23122, 23132, 231a2, 231b2 inner end
131a, 131a', 131a", 131a''', 131a'''', 231a, 231a' peripheral section
131b, 131b', 131b", 131b''', 131b'''', 231b, 231b' central section
14 base portion
140, 240 chamber
2312, 2312' inward extension section
C1, C2 center of mass
L1, L2, L3 length
LC1, LC2 axis
LP1, LP2 straight line
P1, P2, P3, P4 point
X1 first axial direction
X2 second axial direction
θ1, θ2 angle

The invention claimed is:

1. A microelectromechanical system (MEMS) apparatus with adjustable spring, comprising:
   a central portion, comprising a center of mass;
   a heater, disposed on the central portion;
   a peripheral portion, surrounding the central portion and spaced apart from the central portion; and
   at least one spring, comprising:
      a central section, extending along an axis that passes through the center of mass, wherein the central section has an inner end and an outer end, and the inner end of the central section connects to the central portion;
      a peripheral section, extending along a direction parallel to the axis, wherein the peripheral section has an inner end and an outer end, and the outer end of the peripheral section connects to the peripheral portion;
      an outward extension section, having an inner end and an outer end; and
      an inner connection section, connecting to the inner end of the peripheral section and the inner end of the outward extension section respectively;
   wherein an amount of thermal expansion per unit temperature change of the outward extension section is greater than an amount of thermal expansion per unit temperature change of the peripheral section or greater than an amount of thermal expansion per unit temperature change of the central section.

2. The MEMS apparatus with adjustable spring as claimed in claim 1, wherein the amount of thermal expansion per unit temperature change of the outward extension section is greater than the amount of thermal expansion per unit temperature change of the peripheral section and greater than the amount of thermal expansion per unit temperature change of the central section.

3. The MEMS apparatus with adjustable spring as claimed in claim 1, wherein the at least one spring further comprises an inward extension section and an outer connection section, the inward extension section has an inner end and an outer end, the outer connection section connects to the outer end of the outward extension section and the outer end of the inward extension section respectively, the amount of thermal expansion per unit temperature change of the outward extension section is greater than an amount of thermal expansion per unit temperature change of the inward extension section.

4. The MEMS apparatus with adjustable spring as claimed in claim 1, wherein an effective coefficient of thermal expansion of the outward extension section is greater than an effective coefficient of thermal expansion of the peripheral section or greater than an effective coefficient of thermal expansion of the central section.

5. The MEMS apparatus with adjustable spring as claimed in claim 4, wherein the effective coefficient of thermal expansion of the outward extension section is greater than the effective coefficient of thermal expansion of the peripheral section and greater than the effective coefficient of thermal expansion of the central section.

6. The MEMS apparatus with adjustable spring as claimed in claim 4, wherein the outward extension section comprises a base layer and an adjustment layer, the peripheral section comprises a base layer and an adjustment layer, the central section comprises a base layer and an adjustment layer, a volume ratio of the adjustment layer of the peripheral section to the base layer of the peripheral section is defined as a first volume ratio, a volume ratio of the adjustment layer of the outward extension section to the base layer of the outward extension section is defined as a second volume ratio, a volume ratio of the adjustment layer of the central section to the base layer of the central section is defined as a third volume ratio V3.

7. The MEMS apparatus with adjustable spring as claimed in claim 6, wherein the adjustment layer of the outward extension section, the adjustment layer of the peripheral section and the adjustment layer of the central section have a same adjustment layer material, the base layer of the outward extension section, the base layer of the peripheral section and the base layer of the central section have a same base layer material.

8. The MEMS apparatus with adjustable spring as claimed in claim 6, wherein a coefficient of thermal expansion of the adjustment layer of the outward extension section is greater than a coefficient of thermal expansion of the adjustment layer of the peripheral section or greater than a coefficient of thermal expansion of the adjustment layer of the central section, and the first volume ratio, the second volume ratio and the third volume ratio are equal.

9. The MEMS apparatus with adjustable spring as claimed in claim 8, wherein the coefficient of thermal expansion of the adjustment layer of the outward extension section is greater than the coefficient of thermal expansion of the adjustment layer of the peripheral section and greater than the coefficient of thermal expansion of the adjustment layer of the central section.

10. The MEMS apparatus with adjustable spring as claimed in claim 7, wherein a coefficient of thermal expansion of the adjustment layer material is greater than a coefficient of thermal expansion of the base layer material, and the second volume ratio is greater than the first volume ratio or greater than the third volume ratio.

11. The MEMS apparatus with adjustable spring as claimed in claim 10, wherein the coefficient of thermal expansion of the adjustment layer material is greater than the coefficient of thermal expansion of the base layer material, and the second volume ratio is greater than the first volume ratio and greater than the third volume ratio.

12. The MEMS apparatus with adjustable spring as claimed in claim 7, wherein a coefficient of thermal expansion of the adjustment layer material is less than a coefficient of thermal expansion of the base layer material, and the second volume ratio is less than the first volume ratio or less than the third volume ratio.

13. The MEMS apparatus with adjustable spring as claimed in claim 12, wherein the coefficient of thermal expansion of the adjustment layer material is less than the coefficient of thermal expansion of the base layer material, and the second volume ratio is less than the first volume ratio and less than the third volume ratio.

14. The MEMS apparatus with adjustable spring as claimed in claim 3, wherein an effective coefficient of thermal expansion of the outward extension section is greater than an effective coefficient of thermal expansion of the inward extension section.

15. The MEMS apparatus with adjustable spring as claimed in claim 14, wherein the peripheral section comprises a base layer and an adjustment layer, the outward extension section comprises a base layer and an adjustment layer, the central section comprises a base layer and an adjustment layer, the inward extension section comprises a base layer and an adjustment layer, a volume ratio of the adjustment layer of the peripheral section to the base layer of the peripheral section is defined as a first volume ratio, a volume ratio of the adjustment layer of the outward extension section to the base layer of the outward extension section is defined as a second volume ratio, a volume ratio of the adjustment layer of the central section to the base layer of the central section is defined as a third volume ratio, and a volume ratio of the adjustment layer of the inward extension section to the base layer of the inward extension section is defined as a fourth volume ratio.

16. The MEMS apparatus with adjustable spring as claimed in claim 15, wherein the adjustment layer of the outward extension section and the adjustment layer of the inward extension section have a same adjustment layer material, and the base layer of the outward extension section and the base layer of the inward extension section have a same base layer material.

17. The MEMS apparatus with adjustable spring as claimed in claim 15, wherein a coefficient of thermal expansion of the adjustment layer of the outward extension section is greater than a coefficient of thermal expansion of the adjustment layer of the inward extension section, and the second volume ratio is equal to the fourth volume ratio.

18. The MEMS apparatus with adjustable spring as claimed in claim 16, wherein a coefficient of thermal expansion of the adjustment layer material is greater than a coefficient of thermal expansion of the base layer material, and the second volume ratio is greater than the fourth volume ratio.

19. The MEMS apparatus with adjustable spring as claimed in claim 16, wherein a coefficient of thermal expansion of the adjustment layer material is less than a coefficient of thermal expansion of the base layer material, and the second volume ratio is less than the fourth volume ratio.

20. The MEMS apparatus with adjustable spring as claimed in claim 1, wherein the at least one spring is made of a single material, a length of the outward extension section along a direction parallel to the axis is greater than a length of the peripheral section along a direction parallel to the axis or greater than a length of the central section along a direction parallel to the axis.

21. The MEMS apparatus with adjustable spring as claimed in claim 20, wherein the length of the outward extension section along the direction parallel to the axis is greater than the length of the peripheral section along the direction parallel to the axis and greater than the length of the central section along the direction parallel to the axis.

22. The MEMS apparatus with adjustable spring as claimed in claim 20, wherein the at least one spring further comprises an inward extension section and an outer connection section, the inward extension section has an inner end and an outer end, the outer connection section connects to the outer end of the outward extension section and the outer end of the inward extension section respectively, a length of the outward extension section along a direction parallel to the axis is greater than a length of the inward extension section along a direction parallel to the axis.

23. The MEMS apparatus with adjustable spring as claimed in claim 1, wherein the at least one spring comprises a first spring and a second spring, the first spring and the second spring are symmetric with respect to the center of mass and are connected to the central portion point-symmetrically.

24. The MEMS apparatus with adjustable spring as claimed in claim 23, wherein the at least one spring further comprises a third spring and a fourth spring, the third spring and the fourth spring are symmetric with respect to the center of mass and are connected to the central portion point-symmetrically.

* * * * *